United States Patent
Pinarbasi

(10) Patent No.: US 6,296,741 B1
(45) Date of Patent: Oct. 2, 2001

(54) METHOD OF MAKING OXIDE BARRIER LAYER FOR A SPIN TUNNEL JUNCTION

(75) Inventor: Mustafa Pinarbasi, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/344,457

(22) Filed: Jun. 25, 1999

(51) Int. Cl.[7] .................................................. C23C 14/34
(52) U.S. Cl. ................................... 204/192.11; 204/192.2
(58) Field of Search .......................... 204/192.11, 192.12, 204/192.15, 192.2, 298.04, 198.38; 427/528, 529, 531; 365/173

(56) References Cited

U.S. PATENT DOCUMENTS

| | | | |
|---|---|---|---|
| 4,920,094 | * 4/1990 | Nogawa et al. | 204/192.11 |
| 4,923,585 | * 5/1990 | Krauss et al. | 204/298.04 |
| 4,994,164 | * 2/1991 | Bernardet et al. | 204/192.38 |
| 5,454,919 | * 10/1995 | Hill et al. | 204/298.04 |
| 5,650,958 | * 7/1997 | Gallagher et al. | 365/173 |
| 5,750,275 | * 5/1998 | Katz et al. | 360/126 |
| 5,768,065 | * 6/1998 | Ito et al. | 360/113 |
| 5,768,071 | * 6/1998 | Lin | 360/113 |
| 5,898,547 | * 4/1999 | Fontana, Jr. et al. | 365/173 |
| 5,962,080 | * 10/1999 | Tan et al. | 204/192.11 |

* cited by examiner

Primary Examiner—Nam Nguyen
Assistant Examiner—Gregg Cantelmo
(74) Attorney, Agent, or Firm—Gray Cary Ware & Freidenrich; Ervin F. Johnston

(57) ABSTRACT

A method forms an aluminum oxide ($Al_2O_3$) barrier layer for a tunnel junction sensor. A wafer substrate and an aluminum (Al) target are provided in a sputtering chamber which may have first and second ion beam guns. The first ion beam gun ionizes a noble gas which causes the aluminum target to sputter aluminum atoms onto the wafer substrate. Simultaneously with depositing the aluminum atoms on the wafer substrate the second ion beam gun is employed for providing ionized oxygen which is disseminated within the chamber and reacts with the aluminum atoms on the wafer substrate to form the aluminum oxide barrier layer. Optionally, the second gun may be omitted and oxygen ($O_2$) gas introduced into the chamber through an inlet.

12 Claims, 5 Drawing Sheets

METHOD OF MAKING OXIDE BARRIER LAYER FOR A SPIN TUNNEL JUNCTION

BACKGROUND OF THE INVENTION

1. Field of the Invention

The present invention relates to a method of making an oxide barrier layer for a spin tunnel junction and, more particularly, to implementing oxidation of a metal that forms a barrier junction without surface contamination.

2. Description of the Related Art

The heart of a computer is an assembly that is referred to as a magnetic disk drive. The magnetic disk drive includes a rotatable magnetic disk, a slider with write and read heads supported by a suspension arm above the disk and an actuator that swings the suspension arm to place the read and write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider to cause the slider and the write and read heads to ride on an air bearing a slight distance from the surface of the rotating disk. During rotation of the disk the write head writes magnetic bits of information to the disk and the read senses the magnetic bits from the disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A magnetic gap is formed between the first and second pole piece layers by a write gap layer at an air bearing surface (ABS) of the write head. The pole piece layers are connected at a back gap. Current conducted to the coil layer induces a magnetic field across the gap between the pole pieces. This field fringes across the gap at the ABS for the purpose of writing the aforementioned magnetic bits in circular tracks on the rotating disk.

The read head includes a sensor which senses the aforementioned magnetic bits from the rotating disk. One type of sensor is a spin tunnel junction sensor which includes an oxide barrier layer between a ferromagnetic pinned layer and a ferromagnetic free layer. The pinned layer is located on, and exchanged coupled to, an antiferromagnetic layer which pins a magnetic moment of the pinned layer in a first direction which is typically perpendicular to the ABS. The free layer has a magnetic moment which is free to rotate in response to magnetic fields from the rotating disk. A tunneling current $I_T$ is conducted through the spin tunnel junction sensor in a direction perpendicular to the surface planes of the layers. Because of a magnetoresistive affect between the free and pinned layers there is a change in resistance of the spin tunnel junction sensor as a function of cos θ, where θ is the angle between the magnetic moments of the pinned and free layers. When the magnetic moment of the free layer is parallel to the magnetic moment of the pinned layer the resistance to the tunneling current is at a minimum, and when these moments are antiparallel with respect to one another the resistance to the tunneling current is at a maximum. Accordingly, as the tunneling current $I_T$ is conducted through the tunnel junction sensor, an increase or decrease in the resistance of the sensor causes a change in potential in the aforementioned processing circuitry. The processing circuitry employs these potential changes to produce readback signals.

In order for the tunneling effect to work properly the oxide barrier layer must be extremely thin, such as 10 Å–20 Å thick. The barrier layer must be smooth and uniform with a low defect density and a large dielectric strength. Aluminum oxide ($Al_2O_3$) is the most commonly used barrier material. There is a strong-felt need to provide a method of making the barrier layer for a tunnel junction sensor that has the aforementioned attributes.

SUMMARY OF THE INVENTION

I investigated a sputtering deposition technique for forming barrier layers for tunnel junction sensors. In this technique a wafer substrate was placed in an ion beam sputtering chamber and aluminum oxide was sputtered on the wafer substrate to form the barrier layer with a desired thickness. At this stage the barrier layer was aluminum. The aluminum barrier layer was then subjected to oxygen which caused the aluminum to be oxidized to form aluminum oxide. An advantage of this method is that no high energy particles are involved which promotes smooth surfaces and a uniform texture of the aluminum oxide layer. The oxidation which is usually accompanied with heat may take several hours. Unfortunately, I found that the oxidation process causes the aluminum oxide barrier layer to have surface contamination. This surface contamination seriously degrades the tunnel junction effect of the sensor.

In the present invention an ion beam is directed on an aluminum target to cause aluminum atoms to be sputtered from the target and deposited on a wafer substrate. Simultaneously with depositing the aluminum atoms on the wafer substrate ionized oxygen is provided in the chamber that reacts with the aluminum atoms on the wafer substrate to form the aluminum oxide layer. In a preferred embodiment of the invention the oxygen ions are not accelerated toward the aluminum on the substrate. This eliminates any energetic particle bombardment which may deteriorate the barrier layer. The ion beam directed on the aluminum target may be implemented with a first ion beam gun which is located within the chamber. This gun ionizes a noble gas, such as argon (Ar), krypton (Kr) or xenon (Xe), and accelerates the ionized gas toward the aluminum target. A second ion beam gun located in the chamber may be employed for disassociating oxygen to produce oxygen ions which are then disseminated without acceleration within the chamber. Since a vacuum is pulled on the chamber before introduction of any gases the oxygen ions will quickly spread and envelope the aluminum atoms on the wafer substrate to form aluminum oxide. Optionally, oxygen ($O_2$) gas may be introduced into the chamber through an inlet in which case the second ion beam is not used.

An object of the present invention is to provide a method of making an oxide barrier layer for a tunnel junction sensor which has smooth surfaces and a uniform texture.

Another object is to provide a method of making an aluminum oxide barrier layer for a tunnel junction sensor which has smooth surfaces, uniform texture and virtually no contamination.

Other objects and advantages of the invention will become apparent upon reading the following description taken together with the accompanying drawings.

DESCRIPTION OF THE PREFERRED EMBODIMENTS

Figure 1:
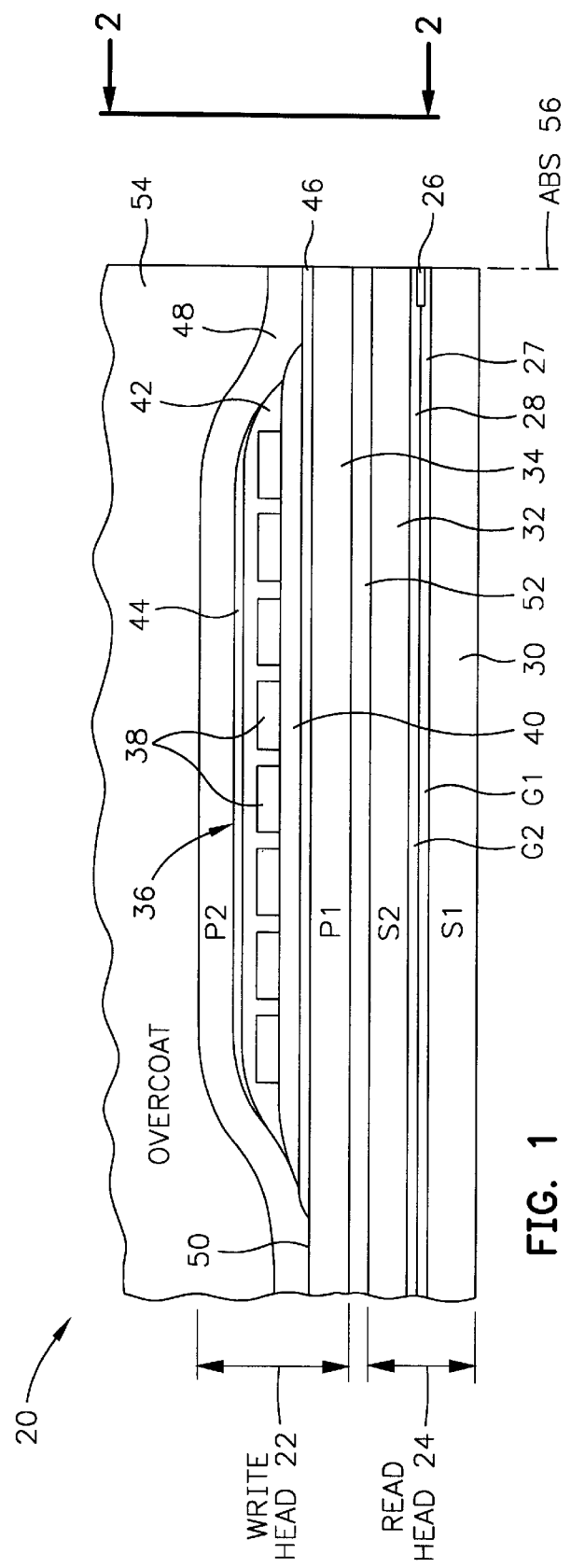
FIG. 1 is an elevation side cross-sectional view of a front portion of an exemplary magnetic head assembly employing read and write heads.

FIG. 1 illustrates a cross-sectional side elevation view of the front portion of a piggyback magnetic head assembly 20 which includes a write head portion 22 and a read head portion 24, the read head portion employing a tunnel junction sensor 26 which is partially made by the present invention. The tunnel junction sensor 26 is located between nonmagnetic metallic first and second gap separation layers (G1) 27 and (G2) 28 and first and second gap separation layers 27 and 28 are located between ferromagnetic first and second shield layers 30 and 32. The first and second shield layers 30 and 32 may be employed for conducting a tunneling current $T_J$, through the tunnel junction sensor 26, which will be explained in more detail hereinbelow.

The write head 22 may include a ferromagnetic first pole piece layer 34 which has a yoke portion between a pole tip portion and a back gap portion. An insulation stack 36, which may include a coil layer 38 that is embedded in first, second and third insulation layers 40, 42 and 44, may be located on the first pole piece layer 34 in the yoke region. A write gap layer 46 is located on the first pole piece layer 34 in the pole tip region and may extend into the yoke region, either below or on top of the insulation stack 36. A ferromagnetic second pole piece layer 48 is located on the write gap layer 46, the insulation stack 36 and is connected to the first pole piece layer 34 in the back gap region at 50. In the piggyback head an electrically insulative separation layer 52 is located between the second shield layer 32 and the first pole piece layer 34. In a merged magnetic head the second shield layer 32 and the first pole piece layer 34 are a common layer in which case the isolation layer 52 is omitted. The invention to be described hereinafter is applicable to either type of magnetic head assembly. On top of the second pole piece layer 48 is an overcoat layer 54 which may be aluminum oxide. The magnetic head assembly has an air bearing surface (ABS) 56 which faces a rotating magnetic disk (not shown) for writing and reading magnetic bits to and from the disk, respectively.

Figure 2:
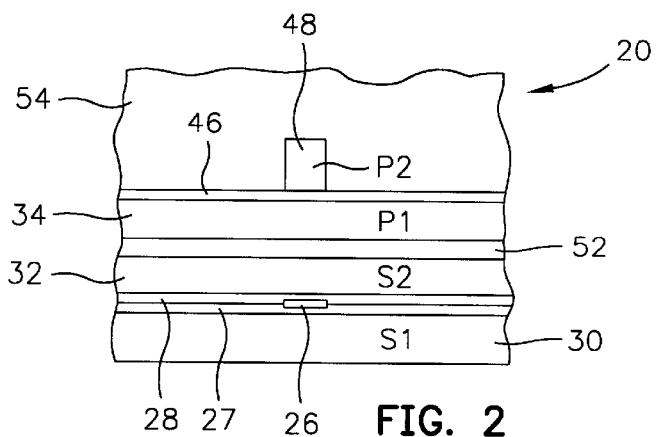
FIG. 2 is a view taken along plane 2—2 of FIG. 1.
Figure 3:
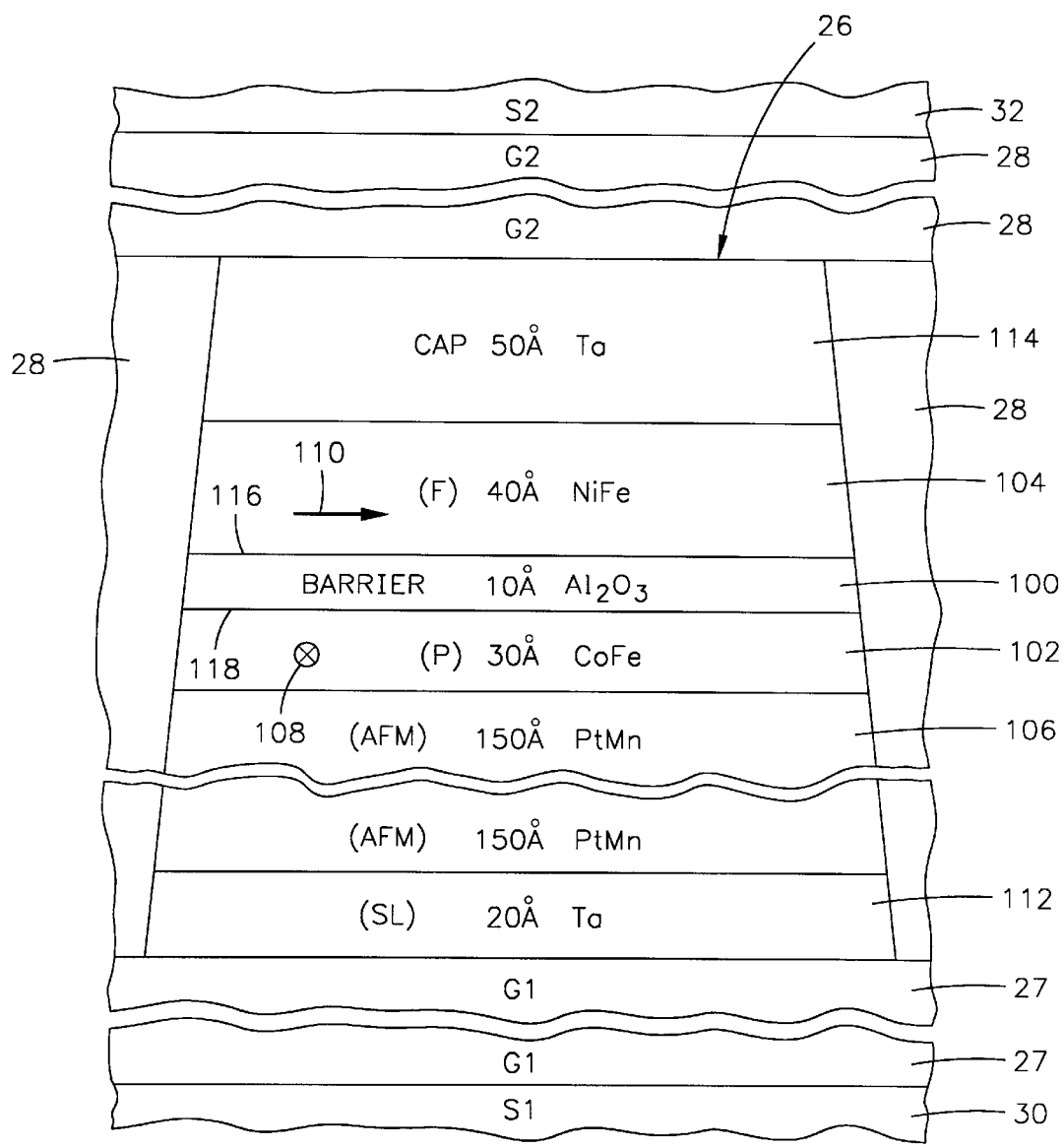
FIG. 3 is an ABS illustration of a typical tunnel junction sensor which has a barrier layer formed by the present invention.

FIG. 3 illustrates an enlarged ABS illustration of the tunnel junction sensor 26 shown in FIGS. 1 and 2. The tunnel junction sensor 26 includes a non-magnetic electrically insulative barrier layer 100 which is located between a ferromagnetic pinned layer (P) 102 and a ferromagnetic free layer (F) 104. The pinned layer 102 is located on, and exchange coupled to, an antiferromagnetic (AFM) layer 106. The magnetic spins of the antiferromagnetic layer 106 pin a magnetic moment 108 of the pinned layer 102 in a direction which is typically perpendicular to the ABS, as shown in FIG. 3. The free layer 104 has a magnetic moment 110 which is typically oriented parallel to the ABS in a quiescent state, namely when the sensor is not sensing magnetic fields from the rotating magnetic disk. When positive and negative fields are sensed by the sensor 26 from the rotating magnetic disk the magnetic moment 110 of the free layer rotates upwardly and downwardly to change the resistance of the sensor to a tunneling current $I_T$, which is conducted through the sensor perpendicular to the surface planes of the layers. The barrier layer 100 is extremely thin which allows conduction electrons to tunnel through the barrier layer with increased or decreased resistance, depending upon whether the magnetic moment 110 is rotated toward or away from the ABS, respectively.

A non-magnetic electrically conductive seed layer (SL) 112 may be located between the antiferromagnetic pinning layer 106 and the first shield layer 30. Furthermore, a non-magnetic electrically conductive cap 114 may be located between the free layer 104 and the second shield layer 32. All of the layers above and below the barrier layer 100 are electrically conductive. The seed layer 112 may make electrical contact with the first shield layer 30 and the cap layer 114 may make electrical contact with the second shield layer 32. The first and second shield layers 30 and 32, which are electrically conductive, may be employed as first and second leads for conducting the tunneling current $I_T$ through the tunnel junction sensor 26.

It is important that the barrier layer 100 be ultrathin (10 Å–20 Å). It is also important that the barrier layer have smooth top and bottom surfaces 116 and 118 and that the texture of the material of the barrier layer between these surfaces be uniform without defects or pinholes. Aluminum oxide ($Al_2O_3$) is typically employed for the barrier layer. It has been found that when aluminum is sputter deposited to form the barrier layer 100, and then subsequently exposed to oxygen to oxidize the aluminum to form aluminum oxide, that the surface 116 of the barrier layer becomes contaminated which seriously degrades performance of the tunnel junction sensor. The present invention, which will be explained hereinafter, overcomes this problem.

Suitable thicknesses and materials of the various layers of the tunnel junction sensor 26 are 20 Å of tantalum (Ta) for the seed layer 112, 150 Å of platinum manganese (PtMn) for the pinning layer 106, 30 Å of cobalt iron (CoFe) for the pinned layer 102, 10 Å of aluminum oxide ($Al_2O_3$) for the barrier layer 100, 40 Å of nickel iron (NiFe) for the free layer 104 and 50 Å of tantalum (Ta) of the cap 114. The first and second gap layers 27 and 28 may be copper (Cu), aluminum (Al), platinum (Pt), chromium (Cr) or tantalum (Ta) with a thickness in a range of 400 Å–1,000 Å. It should be understood that these thicknesses and materials are exemplary. Further, either of the magnetic moments 108 and 110 may be antiparallel to that shown in FIG. 3.

THE INVENTION

Figure 4:
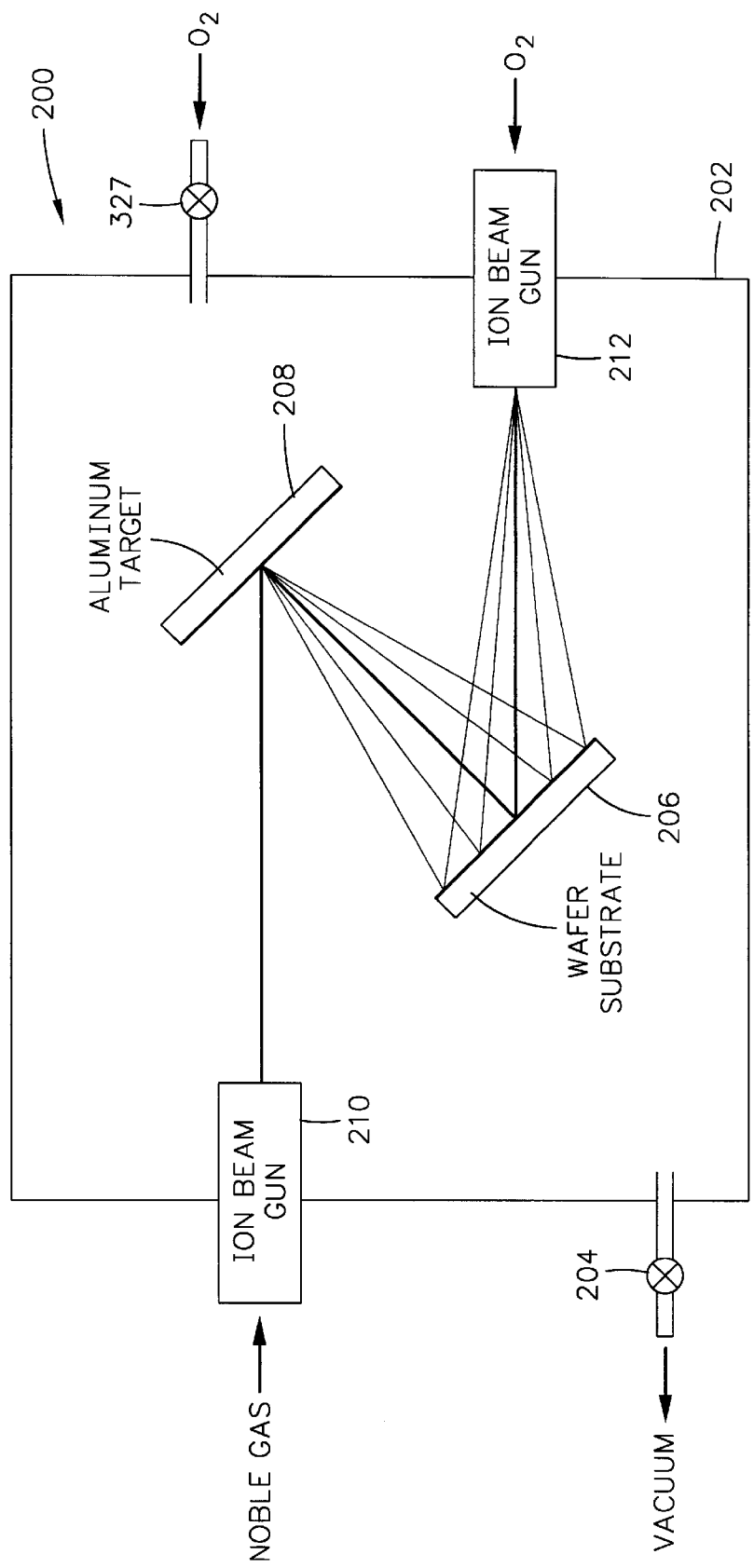
FIG. 4 is a schematic illustration of a sputtering chamber having components employed by the present invention.

FIG. 4 schematically illustrates an exemplary sputtering chamber 200 which may be employed for practicing the present invention. The sputtering chamber 200 includes a chamber 202 which has an inlet/outlet and valve assembly 204 for permitting drawing of a vacuum within the chamber. A wafer substrate 206 is mounted on a fixture (not shown) within the chamber. A target 208 is also mounted on a fixture (not shown) within the chamber. First and second ion beam guns 210 and 212 are located within the chamber and each gun may be capable of generating a plasma and accelerating ionized gas within the chamber. The ion beam gun 210 receives a noble gas, such as argon (Ar), krypton (Kr) or xenon (Xe), which is ionized within the gun and accelerated toward the target 208, which is preferably aluminum (Al). When the noble gas enters the ion beam gun 210 the gun generates a plasma which ionizes the gas and a grid in the gun accelerates the ions toward the target 208. The ions strike the target causing aluminum atoms to be sputtered from the target 208 and deposited on the wafer substrate 206. Simultaneous with sputtering the target 208 the second ion beam gun 212 receives oxygen gas ($O_2$) which is ionized within the gun and disseminated into the chamber which causes ionized oxygen to envelope the wafer substrate 206 and oxidize the aluminum atoms deposited thereon to form aluminum oxide ($Al_2O_3$). While the ion beam gun 212 may have the capability of accelerating ionized oxygen toward the wafer substrate 206 it is preferred that the ionized oxygen be disseminated without acceleration. Without acceleration, energetic particle bombardment of the wafer substrate, which may deteriorate the barrier layer, is avoided. In another embodiment, but less preferred, the ionized oxygen is accelerated toward the wafer substrate 206 by the ion beam gun 212.

Figure 5:
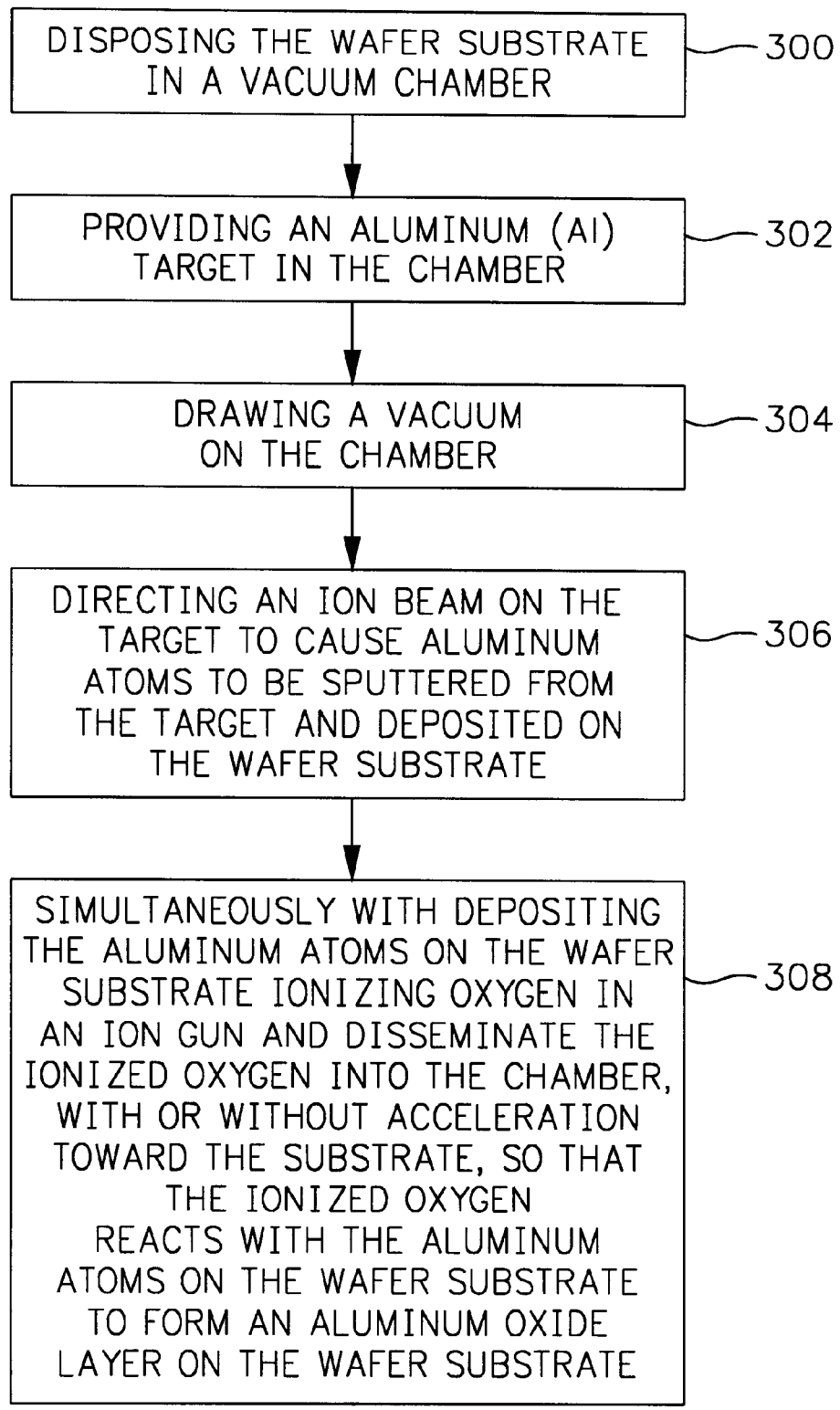
FIG. 5 is a series of steps employed in the present invention.

After forming the layers 30, 112, 106 and 102 in FIG. 3 a wafer substrate (not shown) supporting the partially completed tunnel junction sensor 26 is located in the sputtering chamber 200 for formation of the aluminum oxide barrier layer 100. The method of practicing the present invention is illustrated in FIG. 5, wherein a first step is disposing the wafer substrate 206 in the vacuum chamber 200 as shown at 300, providing an aluminum (Al) target 208 in the chamber as shown at 302, drawing a vacuum on the chamber via 204 as shown at 304, directing an ion beam on the target 208 to cause aluminum atoms to be sputtered from the target and deposited on the wafer substrate 206 as shown at 306 and simultaneously with depositing the aluminum atoms on the wafer substrate, disseminating ionized oxygen in the chamber with or without acceleration that reacts with the aluminum atoms on the wafer substrate 206 to form the aluminum oxide layer on the wafer substrate as shown at 308.

Figure 6:
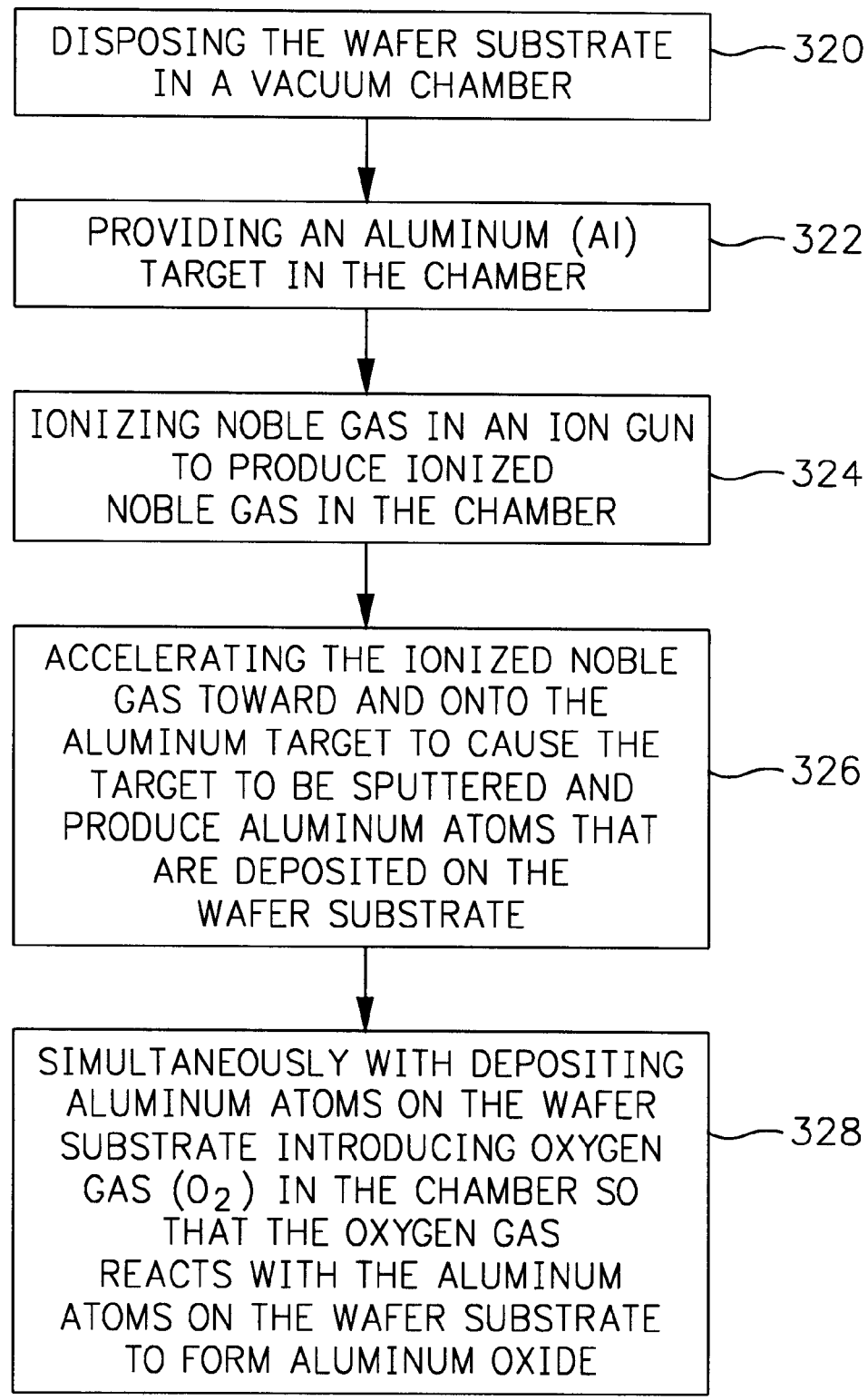
FIG. 6 is another set of steps involved in the present invention.

Another method of the invention is shown in FIG. 6 wherein the first steps 320 and 322 are the same as the steps 300 and 302. Subsequent to the step 322 in FIG. 6 the method includes ionizing a noble gas in the ion beam gun 212 to produce an ionized noble gas in the chamber as shown at 324, accelerating the ionized noble gas toward and onto the aluminum target 208 to cause the aluminum target to be sputtered and produce aluminum atoms that are deposited on the wafer substrate 206, as shown at 326, and simultaneously with depositing the aluminum atoms on the wafer substrate introducing oxygen gas ($O_2$) through an inlet/outlet valve assembly 327 to flood the chamber and react with the aluminum atoms on the wafer substrate to form the aluminum oxide, as shown at 328.

The aforementioned methods may be employed for forming the barrier layer 100 of the tunnel junction sensor 26 shown in FIG. 3. It should be understood, however, that the method may be employed for constructing other metal oxide layers of sensors or semiconductor devices. For instance, the method may be employed for forming the layers 28, 52 and 46 in FIG. 1. These layers are typically aluminum oxide ($Al_2O_3$). It should be understood, however, that the method may be employed for forming metal oxide layers other than aluminum oxide.

Clearly, other embodiments and modifications of this invention will readily occur to those of ordinary skill in the art upon reading these teachings. For instance, the reference to a spin valve sensor may optionally be a magnetoresistive (MR) sensor. Therefore, this invention is to be limited only by the following claims, which include all such embodiments and modifications when viewed in conjunction with the above specification and accompanying drawings.

I claim:

1. A method of forming an aluminum oxide ($Al_2O_3$) layer on a wafer substrate comprising the steps of:
    disposing the wafer substrate in a vacuum chamber;
    providing an aluminum (Al) target in the chamber;
    drawing a vacuum on the chamber;
    directing an ion beam from a first ion beam gun onto the target to cause aluminum atoms to be sputtered from the target and deposited on the wafer substrate; and
    simultaneously with depositing the aluminum atoms on the wafer substrate, providing ionized oxygen in the chamber without acceleration that reacts with the aluminum atoms on the wafer substrate to form said aluminum oxide layer on the wafer substrate without forming pinholes.

2. A method as claimed in claim 1 wherein the step of providing ionized oxygen in the chamber includes the steps of:
    providing a second ion beam gun in the chamber;
    feeding oxygen gas ($O_2$) into the second ion beam gun; and
    operating the second ion beam gun to ionize the oxygen gas and disseminate the ionized oxygen in the chamber without said acceleration.

3. A method as claimed in claim 1 wherein the step of directing an ion beam on the target includes the steps of:
    feeding a noble gas from the group comprising argon (Ar), krypton (Kr) and xenon (Xe) into the first ion beam gun; and
    operating the first ion beam gun to ionize the noble gas and accelerate the ionized noble gas toward and onto the target.

4. A method as claimed in claim 3 wherein the step of providing ionized oxygen in the chamber includes the steps of:
    providing a second ion beam gun in the chamber;
    feeding oxygen gas ($O_2$) into the second ion beam gun; and
    operating the second ion beam gun to ionize the oxygen gas and disseminate the ionized oxygen in the chamber without said acceleration.

5. A method of making a tunnel junction sensor on a wafer substrate comprising the steps of:
    forming an antiferromagnetic pinning layer on the wafer substrate;
    depositing a ferromagnetic pinned layer on the pinning layer;
    forming an aluminum oxide barrier layer on the pinned layer as follows:
        disposing the wafer substrate in a vacuum chamber;
        providing an aluminum (Al) target in the chamber;
        drawing a vacuum on the chamber;
        directing an ion beam from a first ion beam gun onto the target to cause aluminum atoms to be sputtered from the target and deposited on the wafer substrate; and
        simultaneously with depositing the aluminum atoms on the wafer substrate, disseminating ionized oxygen in the chamber without acceleration that reacts with the aluminum atoms on the wafer substrate to form said aluminum oxide barrier layer on the wafer substrate without forming pinholes; and
        forming a ferromagnetic free layer on the aluminum oxide barrier layer.

6. A method as claimed in claim 5 wherein the step of disseminating ionized oxygen in the chamber includes the steps of:
    providing a second ion beam gun in the chamber
    feeding oxygen gas ($O_2$) into the second ion beam gun; and operating the second ion beam gun to ionize the oxygen gas and disseminate the ionized oxygen in the chamber without said acceleration.

7. A method as claimed in claim 5 wherein the step of directing an ion beam on the target includes the steps of:

feeding a noble gas from the group comprising argon (Ar), krypton (Kr) and xenon (Xe) into the first ion beam gun; and operating the first ion gun to ionize the noble gas and accelerate the ionized noble gas toward and onto the target.

8. A method as claimed in claim 7 wherein the step of providing ionized oxygen in the chamber includes the steps of:

providing a second ion beam gun in the chamber;

feeding oxygen gas ($O_2$) into the second ion beam gun; and operating the second ion beam gun to ionize the oxygen gas and disseminate the ionized oxygen in the chamber without said acceleration.

9. A method of making a magnetic head assembly having a read head and a write head on a wafer substrate comprising:

forming the write head on the read head as follows:

forming a ferromagnetic first pole piece layer that has a yoke region located between a pole tip region and a back gap region;

forming an insulation stack with at least one coil layer embedded therein on the first pole piece layer in the yoke region;

forming a nonmagnetic electrically insulative write gap layer on the first pole piece layer in the pole tip region; and forming a ferromagnetic second pole piece layer on the write gap layer, the insulation stack and connected to the first pole piece layer in the back gap region;

before forming the write head, forming the read head as follows:

forming a ferromagnetic first shield layer;

forming a nonmagnetic metallic first gap layer on the first shield layer;

forming a sensor on the first gap layer as follows:

forming an antiferromagnetic pinning layer on the first gap layer;

forming a ferromagnetic pinned layer on and exchange coupled to the pinning layer and having a magnetic moment pinned by the pinning layer;

forming an aluminum oxide barrier layer on the pinned layer as follows:

disposing the wafer substrate in a vacuum chamber;

providing an aluminum (Al) target in the chamber;

drawing a vacuum on the chamber;

directing an ion beam from a first ion beam gun onto the target to cause aluminum atoms to be sputtered from the target and deposited on the wafer substrate; and simultaneously with depositing the aluminum atoms on the wafer substrate, disseminating ionized oxygen in the chamber without acceleration that reacts with the aluminum atoms on the wafer substrate to form said aluminum oxide barrier layer on the wafer substrate without forming pinholes;

forming a ferromagnetic free layer on the aluminum oxide barrier layer that has a magnetic moment that is free to respond to applied fields; and forming a nonmagnetic metallic second gap layer on the free layer.

10. A method as claimed in claim 9 wherein the step of providing ionized oxygen in the chamber includes the steps of:

providing a second ion beam gun in the chamber;

feeding oxygen gas ($O_2$) into the second ion beam gun; and operating the second ion beam gun to ionize the oxygen gas and disseminate the ionized oxygen in the chamber without said acceleration.

11. A method as claimed in claim 9 wherein the step of directing an ion beam on the target includes the steps of:

feeding a noble gas from the group comprising argon (Ar), krypton (Kr) and xenon (Xe) into the first ion beam gun; and operating the first ion gun to ionize the noble gas and accelerate the ionized noble gas toward and onto the target.

12. A method as claimed in claim 11 wherein the step of providing ionized oxygen in the chamber includes the steps of:

providing a second ion beam gun in the chamber;

feeding oxygen gas ($O_2$) into the second ion beam gun; and operating the second ion beam gun to ionize the oxygen gas and disseminate the ionized oxygen in the chamber without said acceleration.

* * * * *